US011088276B2

(12) United States Patent
Suto et al.

(10) Patent No.: US 11,088,276 B2
(45) Date of Patent: Aug. 10, 2021

(54) SILICON CARBIDE SEMICONDUCTOR DEVICE

(71) Applicant: Hitachi, Ltd., Tokyo (JP)

(72) Inventors: Takeru Suto, Tokyo (JP); Naoki Tega, Tokyo (JP); Naoki Watanabe, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/918,810

(22) Filed: Jul. 1, 2020

(65) Prior Publication Data
US 2021/0005746 A1 Jan. 7, 2021

(30) Foreign Application Priority Data

Jul. 5, 2019 (JP) .............................. JP2019-125742

(51) Int. Cl.
| H01L 29/78 | (2006.01) |
| H01L 29/06 | (2006.01) |
| H01L 29/08 | (2006.01) |
| H01L 29/16 | (2006.01) |
| H01L 29/10 | (2006.01) |
| H01L 29/423 | (2006.01) |

(52) U.S. Cl.
CPC ...... *H01L 29/7813* (2013.01); *H01L 29/0696* (2013.01); *H01L 29/1095* (2013.01); *H01L 29/1608* (2013.01); *H01L 29/4236* (2013.01)

(58) Field of Classification Search
CPC . H01L 29/06; H01L 29/0623; H01L 29/0696; H01L 29/08; H01L 29/0878; H01L 29/78; H01L 29/7813; H01L 29/1095; H01L 29/1608; H01L 29/42; H01L 29/4236
USPC .......................................................... 257/77
See application file for complete search history.

(56) References Cited

U.S. PATENT DOCUMENTS

| 2012/0012861 A1* | 1/2012 | Nakano ............... H01L 29/7813 257/77 |
| 2016/0247910 A1 | 8/2016 | Suzuki et al. |
| 2018/0331174 A1* | 11/2018 | Tega ................... H01L 21/0465 |
| 2019/0229211 A1* | 7/2019 | Bu ....................... H01L 29/0865 |

FOREIGN PATENT DOCUMENTS

JP 2015072999 A 4/2015

* cited by examiner

*Primary Examiner* — Fazli Erdem
(74) *Attorney, Agent, or Firm* — Miles & Stockbridge, P.C.

(57) ABSTRACT

A plurality of trench gate electrodes are formed from an upper surface to reach an intermediate depth of an n-type SiC epitaxial substrate including an n-type drain region on a lower surface and an n-type source region on an upper surface in contact with the source region to be arranged in a direction along the upper surface. Here, at least three side surfaces among four side surfaces of each of the trench gate electrodes having a rectangular planar shape are in contact with a p-type body layer below the source region. In addition, a JFET region in the SiC epitaxial substrate and a source electrode connected to the source region immediately above the JFET region extend along a direction in which the plurality of trench gate electrodes are arranged.

14 Claims, 17 Drawing Sheets

SILICON CARBIDE SEMICONDUCTOR DEVICE

BACKGROUND OF THE INVENTION

1. Field of the Invention

The present invention relates to a silicon carbide semiconductor device that is a power semiconductor device, and particularly to a silicon carbide semiconductor device having a trench structure.

2. Description of the Related Art

As a power metal insulator semiconductor field effect transistor (MISFET), which is one of power semiconductor devices, conventionally, a power MISFET using a silicon (Si) substrate (hereinafter referred to as a Si power MISFET) has been mainly used.

However, a power MISFET (hereinafter, referred to as a SiC power MISFET) using a silicon carbide (SiC) substrate (hereinafter, referred to as a SiC substrate) can achieve higher withstand voltage and lower loss than the Si power MISFET. Therefore, SiC power MISFETs have attracted particular attention in the field of power saving or environmentally friendly inverter technology.

The SiC power MISFET can reduce an on-resistance as compared with the Si power MISFET at the same withstand voltage. This is attributed to the fact that silicon carbide (SiC) has a high dielectric breakdown field strength, which is about seven times as high as that of silicone (Si), and thus, a thickness of an epitaxial layer serving as a drift layer can be decreased.

JP 2015-72999 A discloses a semiconductor device including: an n-type substrate made of silicon carbide; an n-type drift layer on the substrate; a plurality of stripe-shaped trenches formed on the drift layer; a gate electrode formed in each of the trenches via an insulating film; and an n-type current dispersion layer that is formed on the drift layer and has a higher impurity concentration than the drift layer. The gate electrode constitutes a metal oxide semiconductor field effect transistor (MOSFET), and the bottom of the trench is covered with a p-type bottom layer.

SUMMARY OF THE INVENTION

In a trench-type SiC power MISFET in which a gate electrode in a trench extends in one direction in a plan view, a channel is formed on two side surfaces (surfaces of the trench on both sides in the lateral direction) of the trench at most among side surfaces of the trench having a rectangular planar shape. Therefore, it is difficult to further increase a channel width (gate width) and reduce a channel resistance in a vertical-type SiC power MISFET having the gate electrode extending in this manner.

In addition, when a source region and a JFET region are formed so as to sandwich a trench in a plan view in an extending direction of the trench, electrons flow from the source region in the extending direction (horizontal direction) along both side surfaces in the lateral direction of the trench, and then, flow to a drain region on a lower surface of a semiconductor substrate subsequently after passing through the JFET region. In a SiC power MISFET having such a horizontal trench, it is difficult to arrange the source region, the trench, and the JFET region sequentially side by side so as to overlap with each other, so that there is a problem that the element area increases.

Other objects and novel characteristics will be apparent from description of the present specification and the attached drawings.

An overview of representatives among embodiments to be disclosed in the present application will be simply described as follows.

In a silicon carbide semiconductor device as one embodiment, a plurality of trench gate electrodes are formed from an upper surface to reach an intermediate depth of a SiC epitaxial substrate including a drain region on a lower surface and a source region on an upper surface in contact with the source region to be arranged in a direction along the upper surface. Here, at least three side surfaces among four side surfaces of each of the trench gate electrodes having a rectangular planar shape are in contact with a body layer below the source region, and a JFET region in the SiC epitaxial substrate and a source electrode connected to the source region immediately above the JFET region extend along a direction in which the plurality of trench gate electrodes are arranged.

An effect that can be obtained by the representatives of the invention to be disclosed in the present application will be simply described as follows.

According to the present invention, the performance of the silicon carbide semiconductor device can be improved.

DESCRIPTION OF THE PREFERRED EMBODIMENTS

Figure 1:
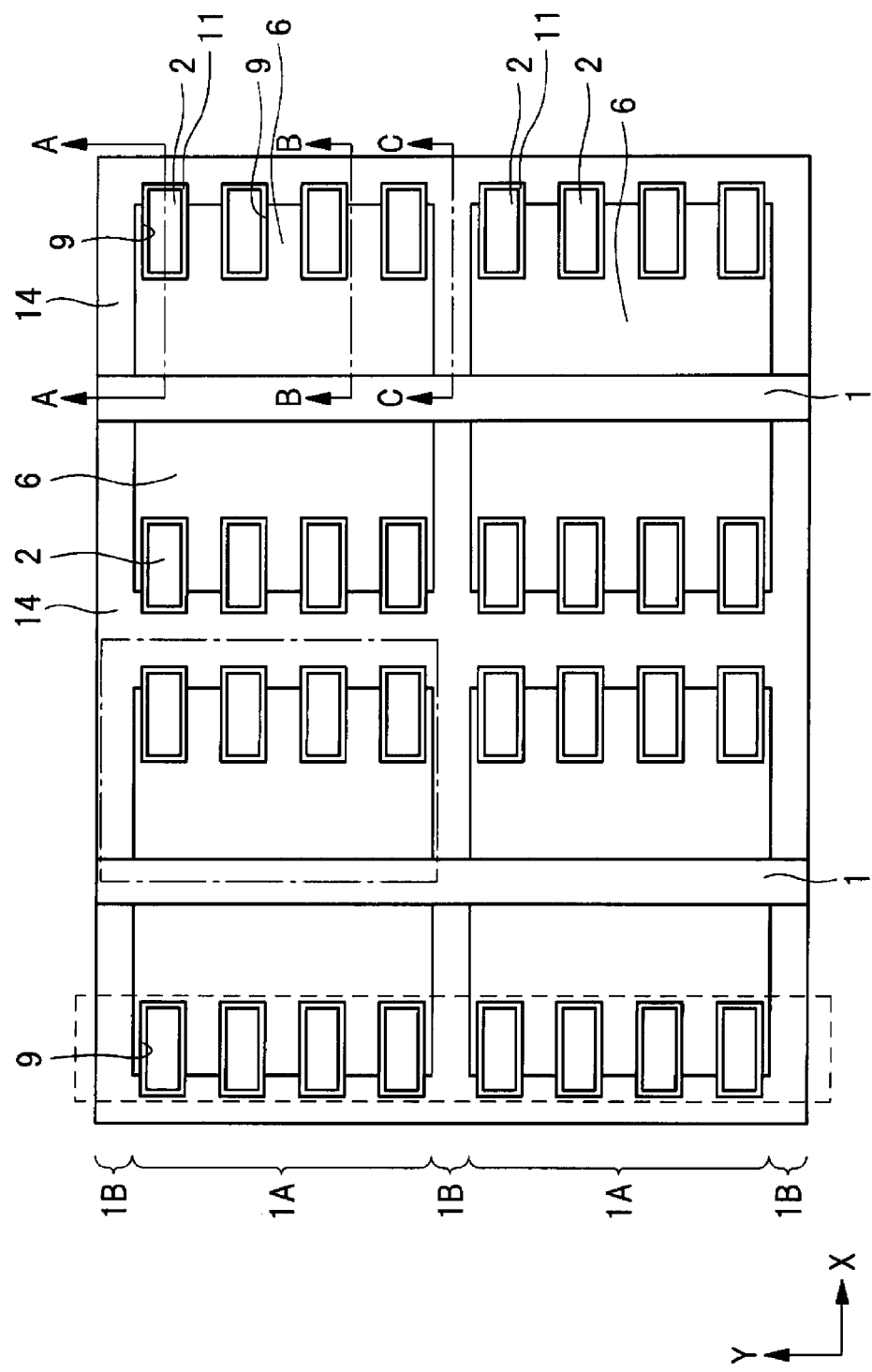
FIG. 1 is a plan view showing a silicon carbide semiconductor device which is a first embodiment of the present invention.

Hereinafter, embodiments of the present invention will be described in detail based on the drawings. Incidentally, the same reference numerals will be attached to members having the same function, in the entire drawing for describing the respective embodiments, and the repetitive description thereof will be omitted. In addition, the description of the same or similar portions will not be repeated in principle unless particularly required in the following embodiments. In addition, in the drawings for describing the embodiments, there is a case where hatching is attached even in a plan view or a perspective view in order to facilitate understanding of the configuration. Further, in the drawings for describing the embodiments, there is a case where hatching is omitted even in a cross-sectional view in order to facilitate understanding of the configuration.

In addition, "−" and "+" are signs expressing relative impurity concentrations whose conductivity types are an n-type or a p-type, and an n-type impurity concentration increases in the order of, for example, "$n^{--}$", "$n^{-}$", "n", "$n^{+}$", and $n^{++}$.

First Embodiment

Hereinafter, a silicon carbide semiconductor device will be described with reference to the drawings by taking a SiC power metal insulator semiconductor field effect transistor (MISFET) having a side surface in a trench (a groove or a recess) as a channel region, that is, a trench MOSFET as an example.

<Structure of Silicon Carbide Semiconductor Device>

Figure 2:
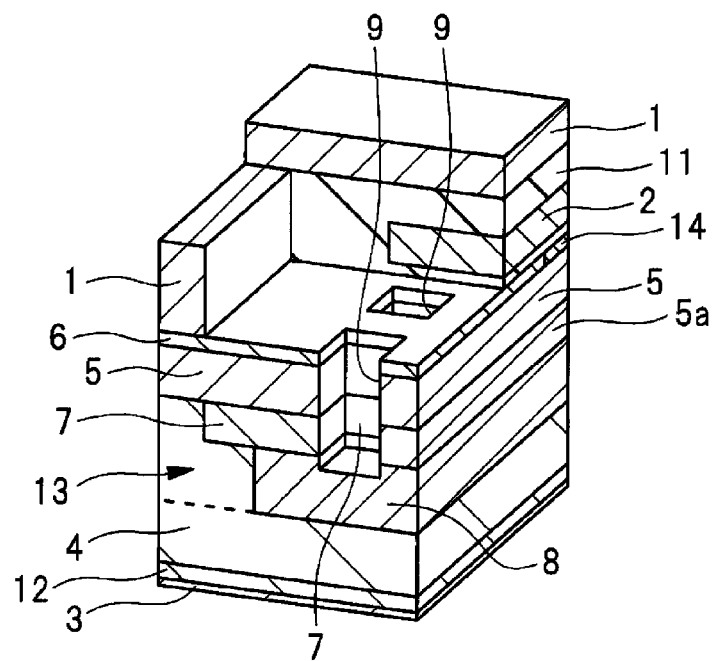
FIG. 2 is a perspective view showing the silicon carbide semiconductor device which is the first embodiment of the present invention.
Figure 3:
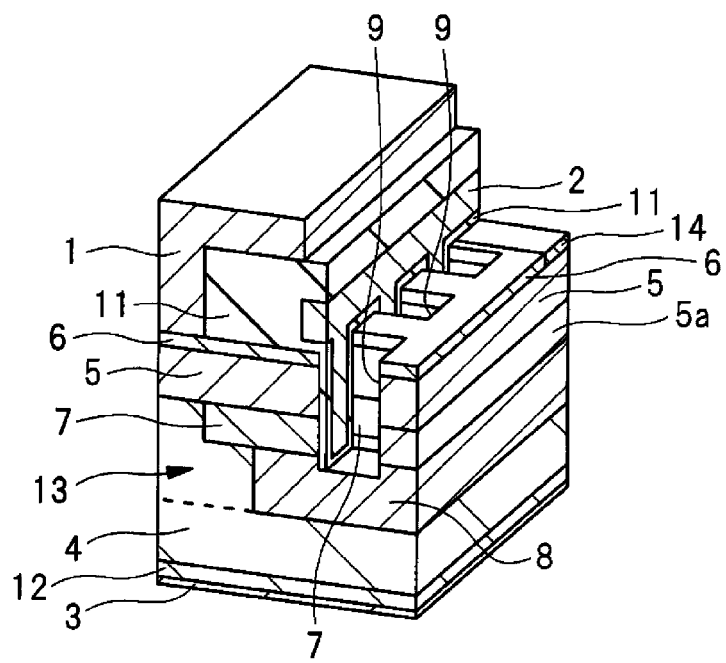
FIG. 3 is a perspective view showing the silicon carbide semiconductor device which is the first embodiment of the present invention.

A structure of a silicon carbide semiconductor device according to a first embodiment will be described with reference to FIGS. 1 to 7. In FIG. 1, an extended portion, which is a part of a source electrode, is shown as a structure on a semiconductor substrate, but a part of an insulating film and a part of a gate electrode which are structures on the semiconductor substrate are not shown. FIGS. 2 and 3 are perspective views of the same portion of the silicon carbide semiconductor device as viewed from the same viewpoint. In FIGS. 2 and 3, however, the insulating film (a gate insulating film and an interlayer insulating film) and the gate electrode at portions different from each other are partially omitted for easy understanding.

As shown in FIG. 1, a cell array constituting the silicon carbide semiconductor device of the present embodiment has a configuration in which a plurality of unit cells having a predetermined planar layout are arranged in a matrix. In FIG. 1, one unit cell is surrounded by a one-dot chain line. An X direction and a Y direction shown in FIG. 1 are directions along an upper surface (main surface) of the semiconductor substrate. The X direction and the Y direction are orthogonal to each other in a plan view. The silicon carbide semiconductor device has a source electrode 1 formed on the semiconductor substrate and extending in the Y direction. In FIG. 1, a plurality of the source electrodes 1 extending in the Y direction are arranged side by side in the X direction, and these source electrodes 1 are integrated via a source electrode 1 (not shown) that covers the cell array on the plurality of source electrodes 1 arranged in a stripe shape, and are electrically connected to each other. The source electrode 1 is electrically connected to a potential fixing region 14 which is a $p^{++}$-type semiconductor region formed on the upper surface of the semiconductor substrate. When referred to as the "source electrode" in the following description, the source electrode 1 indicates a portion (source plug) formed in a stripe shape in a plan view unless otherwise specified, and does not include the source electrode 1 above the plurality of source electrodes 1 arranged in the stripe shape.

One unit cell has: a source region 6 which is an $n^{++}$-type semiconductor region formed on the upper surface of the semiconductor substrate; the potential fixing region 14 surrounding the periphery of the source region 6; and a trench 9 formed on the upper surface of the semiconductor substrate in contact with the source region 6 and the potential fixing region 14 in a plan view. A plurality of the trenches 9 are formed in the Y direction at a boundary between the source region 6 extending in the Y direction and the potential fixing region 14. In FIG. 1, a region where the plurality of trenches 9 are arranged in the Y direction is surrounded by a broken line. A gate electrode 2 is embedded inside each of the trenches 9 via an insulating film 11 which is a gate insulating film. In the present application, the gate electrode 2 in the trench 9 is sometimes referred to as a trench gate electrode. The source electrode 1 extends so as to straddle the source region 6 and the potential fixing region 14 surrounding the periphery of the source region 6. That is, the source region 6 and the potential fixing region 14 are formed immediately below the extending source electrode 1.

One unit cell includes a region 1A and a region 1B arranged in the Y direction. The region 1B is formed at an end portion in the Y direction in the unit cell. The region 1A is a portion where an element operating as a MISFET is formed, and the region 1B is a region that electrically connects a p-type semiconductor region and the source electrode 1 in order to apply a source voltage to the p-type semiconductor region constituting the element. Here, the source region 6 and the trench 9 are formed only in the region 1A, and the source electrode 1 is electrically connected to the potential fixing region 14 which is the $p^{++}$-type semiconductor region in the region 1B.

FIG. 1 shows a structure in which the potential fixing region 14 is in contact with a part of the trench 9 in the region 1A, but the trench 9 and the potential fixing region 14 are separated from each other in perspective views and cross-sectional views illustrated in FIGS. 2 to 7. That is, strictly speaking, the perspective views and cross-sectional views shown in FIGS. 2 to 7 do not show the silicon carbide semiconductor device itself shown in FIG. 1. The trench 9 and the potential fixing region 14 may be either in contact with each other or separated from each other. This is the same in second to fourth modifications of the present embodiment and a second embodiment which will be described below. As shown in FIG. 1, when the trench 9 and the potential fixing region 14 are separated, the periphery of the trench 9 is entirely surrounded by the source region 6 in a plan view, and, for example, the source regions 6 of unit cells adjacent in the X direction are connected to each other.

In the structure shown in FIG. 1, one unit cell has both end portions in the X direction in a plan view, and the source electrode 1 is located at one of the end portions, and the potential fixing region 14 is formed on an upper surface of an epitaxial layer on the other between these end portions. That is, between the end portions on both the sides in the X direction of the unit cell in a plan view, the end portion opposite to the end portion where the source electrode 1 is formed is separated from the source region 6. Therefore, the source regions 6 are connected to each other between a first unit cell and a second unit cell adjacent thereto on one side in the X direction, and the source regions 6 are separated from each other between the first unit cell and a third unit cell adjacent thereto on the other side. However, the source regions may be connected to each other between the first unit cell and the third unit cell as described above (see FIGS. 2 to 7).

As shown in FIG. 1, one unit cell occupies a range in two source electrodes 1 adjacent in the X direction from the center of one source electrode 1 to the middle between these source electrodes 1. In addition, one unit cell occupies a range including one source region 6 and one potential fixing region 14 adjacent to each other among the source regions 6 and the potential fixing regions 14 arranged alternately in the Y direction. in a plan view, a plurality of such unit cells are arranged in the Y direction, and are arranged while being inverted in the X direction. That is, the unit cells adjacent in the X direction have a planar layout that is line-symmetric with respect to a boundary line therebetween as an axis. In other words, structures of the unit cells adjacent in the X direction have a line-symmetric relation in a plan view.

The trench 9 extends in the X direction here, but does not necessarily extend in the X direction. However, a channel width of the SiC power MISFET can be easily increased by extending the trench 9 in the X direction. Such an increase in the channel width is hardly achieved in a trench MOSFET in which a trench gate electrode extends in the Y direction similarly to the source electrode 1. In the present embodiment, however, island-shaped trench gate electrodes are arranged to be separated from each other in the Y direction, and thus, the channel width can be easily increased by extending the trench 9 in the X direction, and an on-resistance of the SiC power MISFET can be reduced. As a result, it is possible to reduce an electrical loss caused by a resistance value of the SiC power MISFET.

In this manner, as one of features of the present embodiment, the plurality of trenches 9 are arranged in the Y direction, and the plurality of trenches 9 are arranged in the Y direction even in one unit cell. The respective gate electrodes (trench gate electrodes) 2 in the plurality of trenches 9 arranged in the Y direction are integrated with a gate pattern extending in the Y direction on the semiconductor substrate, and are electrically connected to each other. The plurality of gate electrodes 2 formed in one unit cell are electrically connected to the plurality of gate electrodes 2 in another unit cell arranged alongside the unit cell in the Y direction.

As shown in FIGS. 2 to 5, the silicon carbide semiconductor device of the present embodiment has an n-type silicon carbide (SiC) epitaxial substrate (hereinafter, referred to as a SiC epitaxial substrate or a semiconductor substrate). The SiC epitaxial substrate (semiconductor substrate) is a stacked substrate constituted by an $n^+$-type silicon carbide substrate containing silicon carbide and an $n^-$-type epitaxial layer (semiconductor layer) formed on the silicon carbide substrate by an epitaxial growth method. The epitaxial layer is a semiconductor layer containing SiC. In each drawing of the present application, a drift layer 4 which is an $n^-$-type semiconductor region mainly constituting the epitaxial layer is shown, and a drain region 12 including a silicon carbide substrate of an $n^+$-type semiconductor region is shown below the drift layer 4. That is, a portion shown as the drain region 12 is the silicon carbide substrate in FIGS. 2 to 5 and other perspective views and cross-sectional views.

That is, the drain region 12 is formed in the semiconductor substrate, and the drift layer 4 is formed on the drain region 12 in contact with the drain region 12 in the semiconductor substrate. An n-type impurity concentration of the drain region 12 is higher than an n-type impurity concentration of the drift layer 4. The drift layer 4, body layers 5 and 5a, the source region 6, a current spreading layer 7, a guard region 8, the drain region 12, a JFET region 13, and the potential fixing region 14 are formed in the epitaxial layer.

The drain electrode 3 is formed in contact with a lower surface of the drain region 12, that is, a lower surface of the semiconductor substrate. That is, the lower surface of the semiconductor substrate is covered with the drain electrode 3, and the drain electrode 3 is electrically connected to the drain region 12. The drain electrode 3 is made of, for example, a stacked conductor film containing gold (Au). The source region 6 is formed on the upper surface of the semiconductor substrate (the upper surface of the epitaxial layer), and the body layer 5 that is a p-type semiconductor region is formed in contact with a lower surface of the source region 6 between the source region 6 and the drift layer 4. The source region 6 has a higher n-type impurity concentration than current spreading layer 7 to be described below, and is electrically connected to the source electrode 1.

The current spreading layer 7, which is an $n^+$-type semiconductor region, is formed in contact with a lower surface of the body layer 5 below the body layer 5. In addition, the drift layer 4 is formed in a region adjacent to the current spreading layer 7 in the X direction, the region immediately below the source electrode 1 extending in the Y direction. Here, the drift layer 4 is formed from the lower surface of the body layer 5 to the lower surface of the epitaxial layer in the epitaxial layer below the body layer 5. That is, the lower surface of the drift layer 4 is in contact with the drain region 12, that is, the silicon carbide substrate. In addition, the p-type body layer 5a is formed in a region adjacent to the current spreading layer 7 in the X direction, the region opposite to the drift layer 4. An upper surface of the body layer 5a is in contact with the body layer 5. In the unit cell, the current spreading layer 7 is located on the source electrode 1 side with respect to the trench 9, and the body layer 5a is located on a side opposite to the source electrode 1 side with respect to the trench 9, in the X direction. The body layers 5 and 5a have the same p-type impurity concentration.

The current spreading layer 7 is a low-resistance region configured to diffuse a current flowing in the drift layer 4 in the X direction and cause the current to flow to a wide region. That is, the current can be prevented from locally flowing by forming the current spreading layer 7. The current spreading layer 7 is formed in the region 1A shown in FIG. 1, and is not formed in the region 1B. That is, the region 1B is separated from the source region 6 and the current spreading layer 7 in a plan view. In other words, the region 1B does not overlap with the source region 6 and the current spreading layer 7 in a plan view.

The guard region 8, which is a p-type semiconductor region, is formed in contact with a lower surface of each of the current spreading layer 7 and the body layer 5a below each of the current spreading layer 7 and the body layer 5a. The trench 9 is formed from the upper surface of the semiconductor substrate (the upper surface of the epitaxial layer), that is, the upper surface of the body layer 5 in the source region 6 to an intermediate depth of the guard region 8. That is, the trench 9 penetrates through the body layer 5 and does not reach a lower surface (lower end) of the guard region 8. In other words, a bottom surface of the trench 9 and the lower surface (lower end) of the guard region 8 are separated from each other.

Since the bottom surface of the trench 9 is located at a position deeper than the upper surface (upper end) of the guard region 8, lower ends of four side surfaces of the trench 9 having a rectangular planar shape are in contact with the guard region 8. That is, all of four sides and four corners of the bottom surface of the trench 9 are covered with the guard region 8. In other words, the bottom surface of the trench 9 and the four side surfaces of the trench 9 are continuously in contact with the guard region 8. That is, the trench 9 is surrounded by the guard region 8 in a plan view. In this manner, the trench 9 is formed from the upper surface of the epitaxial layer to an intermediate depth of the epitaxial layer below the body layer 5.

Between the guard region 8 and the body layer 5, side surfaces of the trench 9 on both sides in the X direction and a side surface of the trench 9 on the source electrode 1 side in the unit cell in a plan view are in contact with the current spreading layer 7. That is, the three side surfaces among the four side surfaces of the trench 9 are in contact with the current spreading layer 7. That is, a part of the current spreading layer 7 overlaps with the trench formation region surrounded by the broken line in FIG. 1 in a plan view. One side surface except for the three side surfaces among the four side surfaces of the trench 9 is in contact with the body layer 5a at the same height as the current spreading layer 7. In addition, of the three side surfaces, each of the side surfaces on both sides in the Y direction of the trench 9 is in contact with both the current spreading layer 7 and the body layer 5a. That is, the trench 9 vertically penetrates the boundary between the current spreading layer 7 and the body layer 5a. On current spreading layer 7, at least three of the four side surfaces of trench 9 are in contact with body layer 5. Here, all four side surfaces of trench 9 are in contact with body layer 5. Therefore, when the SiC power MISFET is in the on-state, channels can be formed on all four side surfaces of the trench 9.

The drift layer 4 is formed in a region adjacent to the guard region 8 in the X direction and immediately below the source electrode 1 extending in the Y direction. A part of the drift layer 4 formed in a region adjacent to the guard region 8 in the X direction overlaps with the current spreading layer 7 in a plan view. That is, the drift layer 4 and the guard region 8 are arranged side by side in the X direction immediately below the current spreading layer 7. That is, an end portion of the current spreading layer 7 on the source electrode 1 side is closer to the source electrode 1 than an end portion of the guard region 8 on the source electrode 1 side in a plan view.

As described above, a layer including the current spreading layer 7 and the body layer 5a and a layer including the guard region 8 are formed so as to overlap in the vertical direction in the region adjacent to the drift layer 4 immediately below the source electrode 1 in the X direction. The body layer 5 and the body layer 5a are in contact with each other and have the same p-type impurity concentration as each other, for example. The guard region 8 has a higher p-type impurity concentration than both the body layer 5 and the body layer 5a. In addition, the body layer 5a and the guard region 8 are in contact with each other. Therefore, the body layers 5 and 5a and the guard region 8 are electrically connected to each other.

The plurality of trenches 9 are formed to be arranged in the Y direction, and the gate electrode 2 is completely embedded in each of the trenches 9 with the insulating film 11 interposed therebetween. The gate electrodes 2 in the respective trenches 9 are formed on the source region 6 via the insulating film 11, and are connected to each other by the gate electrode 2 extending in the Y direction. That is, the gate electrode 2 has a comb-shaped structure in a cross section along the Y direction. That is, the plurality of trench gate electrodes arranged in the Y direction are connected in parallel with each other by the gate electrode 2 above the trench gate electrodes. A lower surface, side surfaces, and an upper surface of the gate electrode 2 extending in the Y direction on the source region 6 are covered with the insulating film 11. That is, the insulating film 11 includes a gate insulating film formed below the gate electrode 2 extending in the Y direction, and an interlayer insulating film formed above the gate insulating film.

The source electrode 1 is formed in a connection hole penetrating through the insulating film 11 on the semiconductor substrate and on the insulating film 11. The source electrode 1 with which the inside of the connection hole is completely filled and the source electrode 1 on the insulating film 11 are integrated with each other. FIG. 2 does not illustrate a part of the source electrode 1 immediately above the source electrode 1 extending in the Y direction and a part of the source electrode 1 on the insulating film 11 in order to facilitate understanding of a shape of the source electrode 1 in the connection hole extending in the Y direction. The source electrode 1 is connected to the potential fixing region 14 at a bottom of the connection hole.

Figure 6:
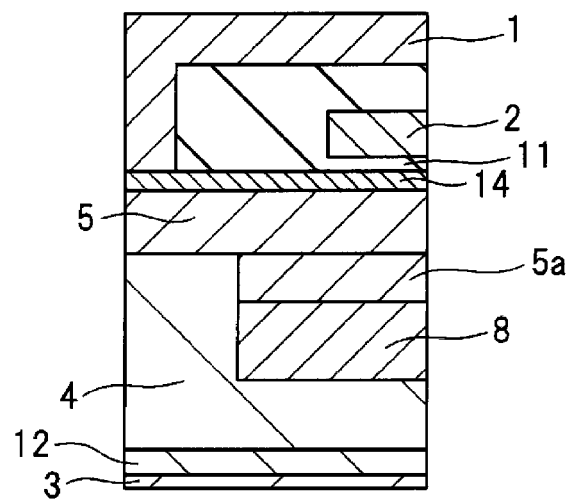
FIG. 6 is a cross-sectional view taken along a line C-C of FIG. 1.

The potential fixing region 14 is formed to be adjacent to the source region 6 in the Y direction. As shown in FIG. 6, the lower surface of the potential fixing region 14 is in contact with the upper surface of the body layer 5. The potential fixing region 14 has a higher p-type impurity concentration than any of the body layers 5 and 5a and the guard region 8. Since the guard region 8 is electrically connected to the source electrode 1 via the body layers 5a and 5 and the potential fixing region 14, a source voltage can be applied from the source electrode 1 to the guard region 8. Since the body layer 5 is electrically connected to the source electrode 1 via the potential fixing region 14, the source voltage can be applied from the source electrode 1 to the body layer 5.

Figure 4:
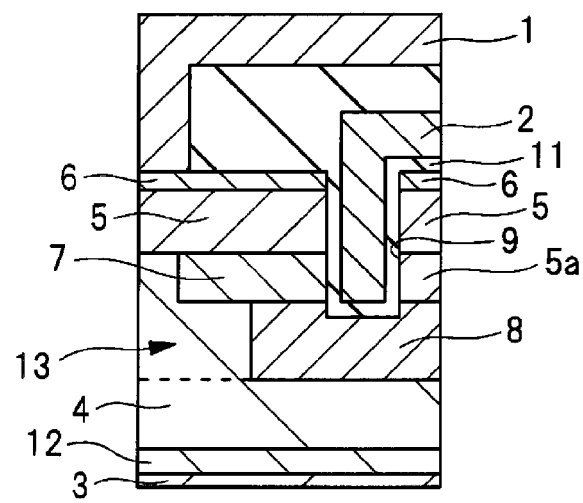
FIG. 4 is a cross-sectional view taken along a line A-A of FIG. 1.
Figure 5:
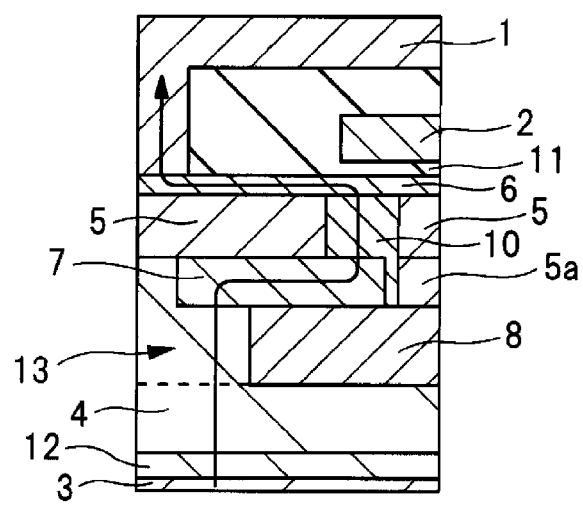
FIG. 5 is a cross-sectional view taken along a line B-B of FIG. 1.
Figure 7:
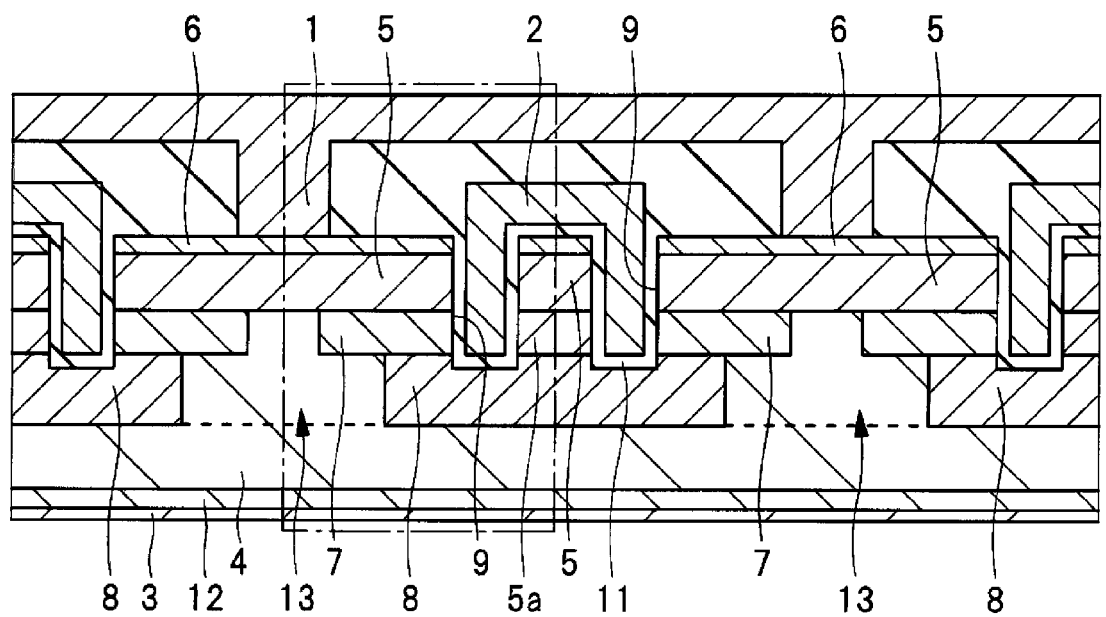
FIG. 7 is a cross-sectional view showing the silicon carbide semiconductor device which is the first embodiment of the present invention.

FIGS. 4 to 6 show cross sections of one unit cell. FIG. 7 shows four unit cells arranged in the X direction, and one unit cell is surrounded by a one-dot chain line. As shown in FIG. 7, the unit cells adjacent in the X direction respectively have structures that are inverted with a boundary between the unit cells as an axis. One unit cell is constituted by the drain electrode 3, the drift layer 4, the body layers 5 and 5a, the source region 6, the current spreading layer 7, the guard region 8, the JFET region 13, the trench 9, the insulating film 11, the gate electrode 2, the source electrode 1, and the potential fixing region 14 (see FIG. 6).

The unit cells adjacent in the X direction share the source electrode 1 extending in the Y direction. Therefore, in the case of forming each of the source electrodes 1 formed in a stripe shape with a minimum width that can be formed, it is possible to shorten a cell pitch of the unit cell in the X direction as compared to a case where all the unit cells are arranged without being inverted in the X direction.

As shown in FIGS. 4, 5, and 7, the junction field effect transistor (JFET) region 13, which is an n-type or n⁻-type semiconductor region, is formed alongside the guard region 8 in the X direction in the drift layer 4 below the current spreading layer 7. Specifically, immediately below the current spreading layer 7, the JFET region 13 is adjacent to the guard region 8, and a part of the JFET region 13 is adjacent to the current spreading layer 7 in the X direction. The JFET region 13 extends in the Y direction immediately below the source electrode 1. That is, the source electrode 1, the trench formation region in which the plurality of trenches 9 are arranged (see FIG. 1), and the JFET region 13 extend in the Y direction in parallel with each other. A lower end of the JFET region 13 is indicated by a broken line in FIGS. 4, 5, and 7.

An n-type impurity concentration of the JFET region 13 is equal to or higher than the n-type impurity concentration of the drift layer 4. In addition, the n-type impurity concentration of JFET region 13 is lower than the n-type impurity concentration of each of the current spreading layer 7 and the source region 6. The JFET region 13 is a region between the guard regions 8 (see FIG. 7) adjacent in the X direction. That is, the JFET region 13 is a region where depletion layers extend from each of the opposing side surfaces of the adjacent guard regions 8, and the depletion layers are in contact with each other when the SiC power MISFET is in an off-state.

Next, an operation of the SiC power MISFET of the present embodiment will be described with reference to FIG. 5. The SiC power MISFET includes at least the drain region 12, the source region 6, the body layer 5, and the gate electrode 2. When the SiC power MISFET is in the on-state, a channel 10 is formed in the body layer 5 and the body layer 5a adjacent to the trench 9 (not shown) as shown in FIG. 5. That is, out of the channel 10 generated in the portion shown in FIG. 5, a portion on the current spreading layer 7 is generated in the body layer 5, and a portion adjacent to the current spreading layer 7 is generated in the body layer 5a. That is, the channel 10 is generated in the p-type semiconductor region adjacent to the trench 9. Since all the four side surfaces of the trench 9 are in contact with the body layer 5 in the present embodiment, the channel 10 is formed on all the four side surfaces. At this time, the current flows from the drain electrode 3 to the source electrode 1 side after passing through the drain region 12, the drift layer 4, the JFET region 13, the current spreading layer 7, the channel 10 (the body layers 5 and 5a), and the source region 6 in order.

In addition, no current flows when the SiC power MISFET is in the off-state because the channel 10 is not formed. However, the guard region 8 and the JFET region 13 are provided below the trench 9 in order to suppress a minute current between the source and the drain in the off-state and to improve a withstand voltage. That is, the depletion layers are closed in the JFET region 13 between the adjacent guard regions 8 during an off-operation of the SiC power MISFET since the guard region 8 is provided, and thus, a current path between the source and the drain is cut off. That is, the guard region 8 has a role of connecting the depletion layers generated in the periphery thereof between the adjacent guard regions 8 to suppresses the minute current and improves the withstand voltage. Accordingly, the withstand voltage in the off-state can be ensured even if the impurity concentration of the drift layer 4 is enhanced for the purpose of lowering an element resistance. In addition, the guard region 8 has a role of preventing an electric field from being concentrated on the vicinity of the corner of the trench 9 and preventing occurrence of dielectric breakdown between the epitaxial layer and the gate electrode 2.

Here, the current spreading layer 7 is the n-type semiconductor region formed by ion-implanting an n-type impurity into a p-type semiconductor region after forming a guard region and the p-type semiconductor region on the guard region 8 in the drift layer 4 in a manufacturing process of the silicon carbide semiconductor device. That is, the current spreading layer 7 is formed by reversely implanting n-type impurity ions to the p-type semiconductor region. Accordingly, the n-type impurity concentration of the current spreading layer 7 is higher than the p-type impurity concentration of the guard region 8. In other words, the amount of n-type impurities per unit deposition of the current spreading layer 7 is larger than the amount of p-type impurities per unit deposition of the guard region 8. Since the impurity concentration of the current spreading layer 7 is higher than the impurity concentration of the guard region 8, current diffusion performance obtained by the current spreading layer 7 is improved, and a region where the current flows in the drift layer 4 can be expanded in the horizontal direction. Accordingly, the resistance of the SiC power MISFET can be reduced.

Since the current spreading layer 7 is formed by the ion implantation of the n-type impurity into the p-type semiconductor region after forming the guard region and the p-type semiconductor region on the guard region 8 in the drift layer 4, a height of the lower surface of the current spreading layer 7 is the same either immediately above the guard region 8 or immediately above the JFET region 13. That is, the entire current spreading layer 7 is formed above the upper surface of the guard region 8, and the current spreading layer 7 is not formed in a region adjacent to the guard region 8 in the horizontal direction. That is, only the JFET region 13 (drift layer 4) having a lower impurity concentration than the current spreading layer 7 is formed between the guard regions 8 adjacent to each other in the X direction. Incidentally, the horizontal direction in the present application is a direction along the upper surface of the semiconductor substrate, and the vertical direction in the present application is a direction perpendicular to the upper surface of the semiconductor substrate.

As a result, there is no high-concentration current path between the adjacent guard regions 8, and thus, the depletion layers are easily closed between the adjacent guard regions 8 in the off-state of the element. Therefore, the reliability of the silicon carbide semiconductor device can be enhanced.

The body layers 5 and 5a and the guard region 8 shown in FIGS. 4 to 7 are regions that are set to an electrically floating state when not being electrically connected to the source electrode 1, and tend to have charges remaining thereon. In such a case, after the SiC power MISFET performs a predetermined operation (an on-operation or off-operation), the charges are held in the corresponding operation state without any change in the body layers 5 and 5a and the guard region 8. This makes a switching operation using the SiC power MISFET unstable, and thus, the reliability of the SiC power MISFET is likely to deteriorate.

In the present embodiment, however, the potential fixing region 14 is continuously formed from the region 1B to the end portion of the unit cell in the X direction, that is, the vicinity of the trench 9 (see FIG. 1). As a result, it is possible to easily supply a source potential from a connection portion between the source electrode 1 and the potential fixing region 14 to the guard region 8 immediately below the trench 9 which is relatively far. Since the current spreading layer 7 extending in the Y direction in the region 1A is not provided in the region 1B, it is possible to supply a potential linearly to the guard region 8 without bypassing the outside of the current spreading layer 7 between the guard region 8 and the connection portion between the source electrode 1 and the potential fixing region 14. Accordingly, a potential of the guard region 8 can be fixed, and thus, dielectric breakdown at the corner of the trench 9 is prevented, and the depletion layers can be easily closed between the adjacent guard regions 8 in the off-state of the SiC power MISFET. That is, the withstand voltage performance of the silicon carbide semiconductor device can be enhanced.

As shown in FIG. 4, the trench 9 and the JFET region 13 are separated by the amount of the guard region 8 protruding from the side surface of the trench 9 in the X direction. Specifically, a shortest distance from the side surface of trench 9 to an end portion of the guard region 8 on the source electrode 1 side is 0.3 μm or more in the unit cell. Since the guard region 8 covers the corner of the trench 9 thickly in the horizontal direction in this manner, an electric field at the corner of the trench 9 can be made close to zero, and the occurrence of dielectric breakdown at the corner can be prevented. Since the distance between the side surface of the trench 9 and the JFET region 13 is set to be 0.3 μm or more, the current spreading layer 7 has a high resistance to suppresses a short-circuit current only when a short-circuit fault occurs, and thus, the short-circuit tolerance can be improved with the stable operation. Accordingly, the current is prevented from being concentrated on the inside of the drift layer 4 of the SiC power MISFET, and the short-circuit tolerance of the element can be improved.

When the guard region is formed by implanting p-type impurity ions toward a bottom of the trench after forming the trench, it is difficult to terminate the guard region at a position separated from the side surface of the trench by 0.3 μm or more as described above That is, it is difficult to thickly cover the corner of the trench in the horizontal direction by the guard region. In such a case, a distance between the drift layer (JFET region) and the corner of the trench is short, and thus, it is difficult to prevent the dielectric breakdown at the corner. Here, the guard region 8 and the above-described p-type semiconductor region thereon are formed before a step of forming the trench 9, and the current spreading layer 7 is formed by reversely implanting an n-type impurity to a part of the p-type semiconductor region. Therefore, a boundary between the current spreading layer 7 and the guard region 8 can be formed over the length of 0.3 μm or more in the X direction from the side surface of the trench 9. Accordingly, the distance between the drift layer 4 (JFET region 13) and the corner of the trench 9 can be increased, so that the dielectric breakdown at the corner can be prevented.

<Effect of Silicon Carbide Semiconductor Device>

First, a silicon carbide semiconductor device in which a trench gate electrode extends in the Y direction will be described as a first comparative example. The silicon carbide semiconductor device of the first comparative example includes a trench-type SiC power MISFET in which the gate electrode in the trench extends in one direction (for example, the same direction as a source electrode) in a plan view. In such a SiC power MISFET, among side surfaces of the trench having a rectangular planar shape, a channel is formed on at most two surfaces of the trench (surfaces on both sides in the lateral direction of the trench). It is difficult to further increase a channel width (gate width) to reduce a channel resistance in a vertical-type SiC power MISFET having the extending gate electrode as in the first comparative example.

In contrast, the gate electrode 2 is formed in a comb shape, and the plurality of trench gate electrodes corresponding to teeth of the comb are arranged to be separated from each other in the Y direction in the present embodiment as described with reference to FIGS. 1 to 7. Therefore, the channel width can be easily increased by extending the trench 9 in the X direction, and the channel resistance (on-resistance) of the SiC power MISFET can be reduced. That is, the performance of the silicon carbide semiconductor device can be improved.

In addition, a horizontal-type SiC power MISFET in which a current flows in the horizontal direction on a side surface of a trench will be described as a second comparative example. When a source region and a JFET region are formed so as to sandwich the trench in a plan view in an extending direction of the trench, electrons flow from the source region in the extending direction (horizontal direction) along both side surfaces in the lateral direction of the trench, and then, flow to a drain region on a lower surface of a semiconductor substrate subsequently after passing through the JFET region. In the SiC power MISFET having such a horizontal trench, it is difficult to arrange the source region, the trench, and the JFET region sequentially side by side so as to overlap with each other, so that the element area increases.

On the other hand, the source electrode 1 and the JFET region 13 are arranged so as to overlap in a plan view, and extend in the Y direction in the present embodiment as described with reference to FIGS. 1 to 7. That is, in the unit cell, the trench 9 is not formed between the source electrode 1 and the JFET region 13 in a plan view. Therefore, the width (cell pitch) of the unit cell in the X direction can be reduced as compared with the second comparative example in which the source electrode, the trench, and the JFET region are arranged in order. That is, the unit cell of the SiC power MISFET can be miniaturized, and thus, the performance of the silicon carbide semiconductor device can be improved.

In addition, each of source electrode 1, trench formation region and JFET region 13 extends independently, and thus, each of these three portions can be designed independently. Accordingly, the degree of freedom in designing the silicon carbide semiconductor device can be improved.

<First Modification>

Figure 9:
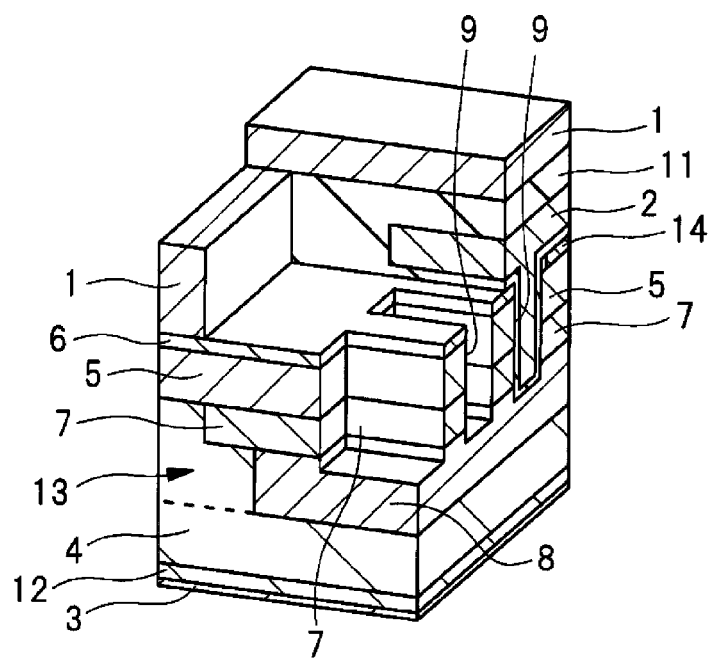
FIG. 9 is a perspective view showing the silicon carbide semiconductor device which is the first modification of the first embodiment of the present invention.
Figure 10:
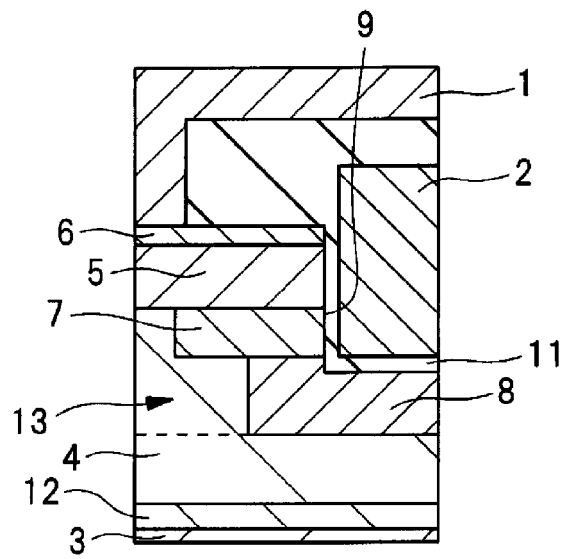
FIG. 10 is a cross-sectional view taken along a line D-D of FIG. 8.
Figure 11:
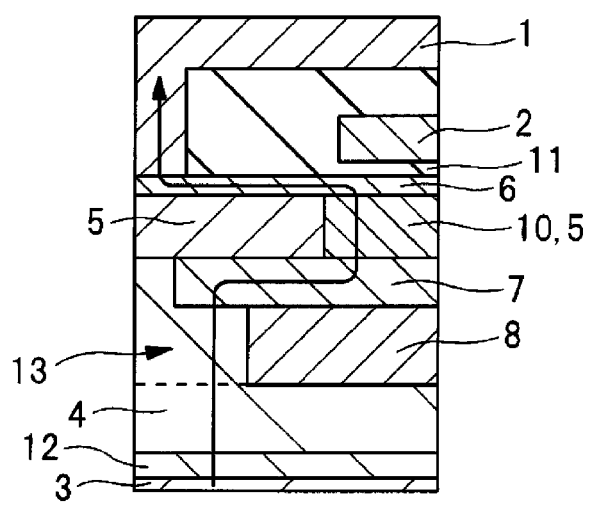
FIG. 11 is a cross-sectional view taken along a line E-E of FIG. 8.
Figure 12:
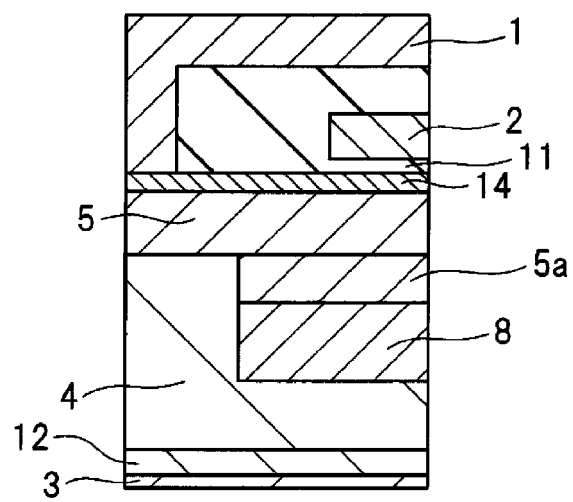
FIG. 12 is a cross-sectional view taken along a line F-F of FIG. 8.

Next, a configuration in which trench gate electrodes are extended in the X direction to connect the trench gate electrodes between adjacent unit cells will be described with reference to FIGS. 8 to 12 as a first modification of the present embodiment. In FIG. 11, a current path is indicated by an arrow.

Figure 8:
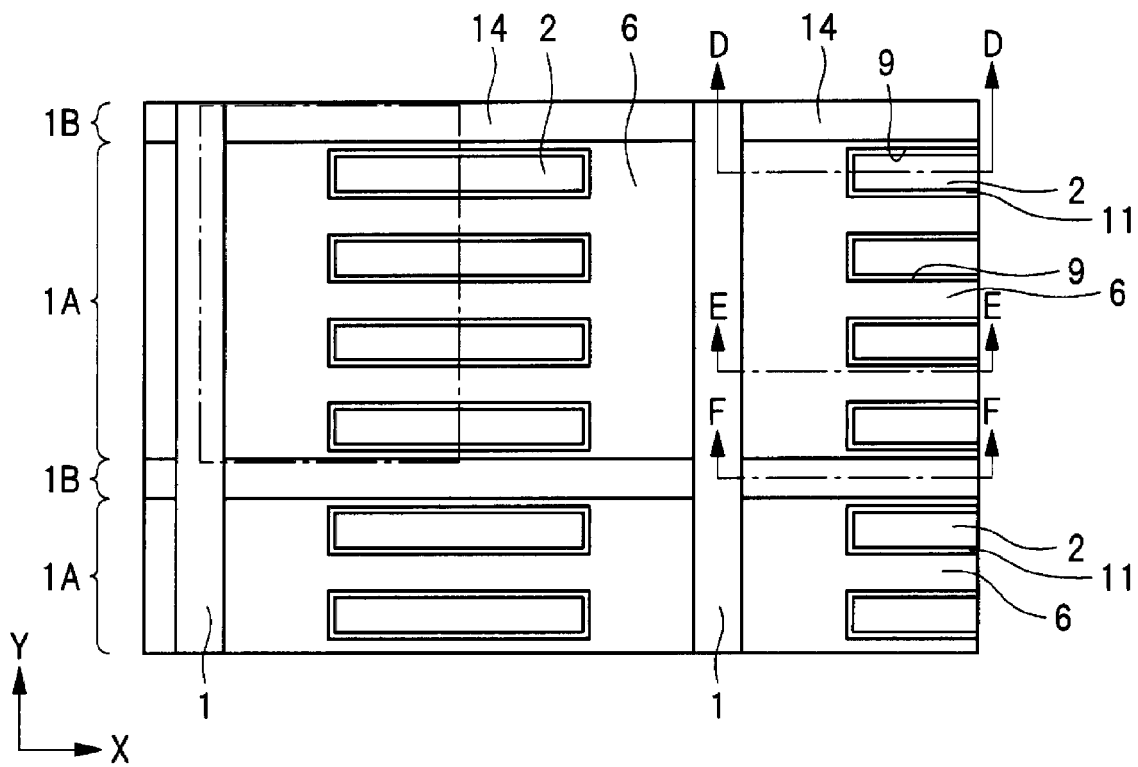
FIG. 8 is a plan view showing a silicon carbide semiconductor device which is a first modification of the first embodiment of the present invention.

As shown in FIG. 8, the source regions 6 are always connected between unit cells adjacent in the X direction, and the source regions 6 extend in the X direction. The trench 9 and the gate electrode 2 extend in the X direction as compared with the structure described with reference to FIGS. 1 to 7, and are integrated with the trench 9 and the gate electrode 2 of another unit cell adjacent in the X direction. That is, a trench gate electrode in a predetermined unit cell is an end portion of the unit cell in the X direction, and is integrated with a trench gate electrode of another unit cell at an end portion opposite to the source electrode 1 side.

In this manner, the area of a side surface of the trench 9 in the Y direction where a channel is formed can be increased by extending the trench 9 and the gate electrode 2 in the X direction in this manner. That is, a channel width of a SiC power MISFET can be increased. Even in this case, the guard region 8 covers all corners of the trench 9 as shown in FIGS. 9 to 11.

In addition, the current spreading layer 7 is continuously in contact with the four side surfaces of the trench 9. That is, each of the trenches 9 is surrounded by the current spreading layer 7 in a plan view. Therefore, the body layer 5a (see FIG. 2) is not formed in the region 1A shown in FIG. 8. In the area 1A shown in FIG. 8, it is difficult to provide a path to supply a source potential to the guard region 8. Therefore, it is necessary to provide the region 1B where the current spreading layer 7 is not formed and the body layer 5a is provided below the body layer 5 in addition to the region 1A.

<Second Modification>

Next, a configuration in which a source region is extended without being divided in the Y direction, and a p-type potential fixing region is deeply formed to reach a guard region will be described with reference to FIGS. 13 to 17 as a second modification of the present embodiment In FIG. 14, a current path is indicated by an arrow. FIG. 16 shows a face, obtained by breaking a portion indicated by a one-dot chain line in FIGS. 14 and 15, in a plan view. The broken face (FIG. 16) along the one-dot chain line is a face passing through the current spreading layer 7. FIG. 17 shows a face, obtained by breaking a portion indicated by a two-dot chain line in FIGS. 14 and 15, in a plan view. The broken face (FIG. 17) along the two-dot chain line is a face passing through the guard region 8. FIGS. 16 and 17 do not illustrate hatching even on a face showing a partially broken semiconductor device for easy understanding.

Figure 13:
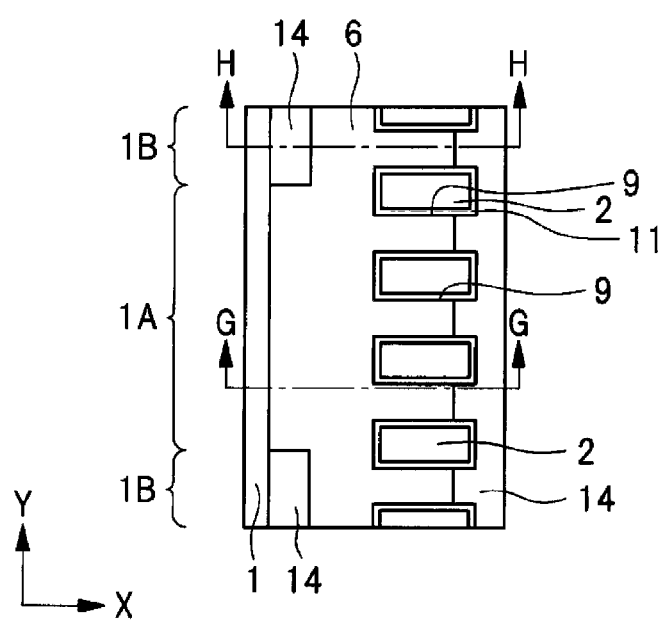
FIG. 13 is a plan view showing a silicon carbide semiconductor device which is a second modification of the first embodiment of the present invention.
Figure 14:
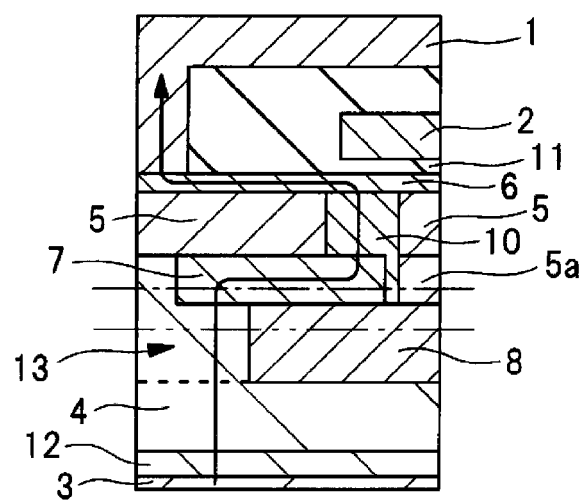
FIG. 14 is a cross-sectional view taken along a line G-G of FIG. 13.

As shown in FIG. 13, the source region 6 of the present modification is not interrupted at an end portion of a unit cell in the Y direction. That is, the source region 6 is formed from one end portion to the other end portion of the unit cell in the Y direction. Here, the potential fixing region 14 is formed in an island shape in a local region including a portion immediately below the source electrode 1 at the end portion of the unit cell in the Y direction. That is, the plurality of potential fixing regions 14 are formed immediately below the source electrode 1 to be arranged in the Y direction, and each of the potential fixing regions 14 is surrounded by the source region 6.

Figure 15:
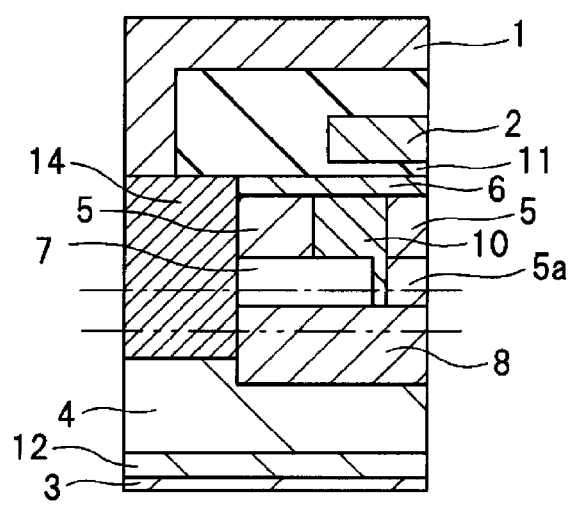
FIG. 15 is a cross-sectional view taken along a line H-H of FIG. 13.
Figure 16:
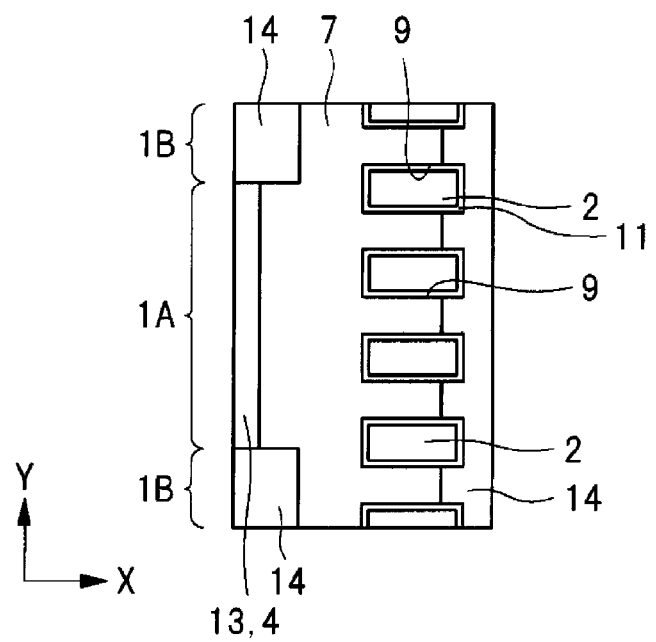
FIG. 16 is a partially-broken plan view showing the silicon carbide semiconductor device which is the second modification of the first embodiment of the present invention.
Figure 17:
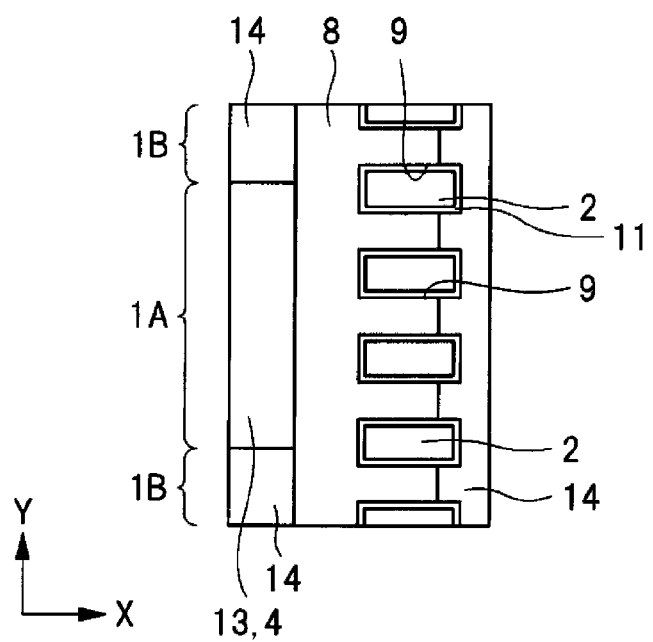
FIG. 17 is a partially-broken plan view showing the silicon carbide semiconductor device which is the second modification of the first embodiment of the present invention.

In addition, the potential fixing region 14 is formed from an upper surface of an epitaxial layer to a position deeper than the current spreading layer 7 and shallower than a lower surface of the guard region 8 as shown in FIGS. 15 to 17. As a result, the potential fixing region 14 formed immediately below the source electrode 1 is in contact with the body layer 5 and is also in contact with the guard region 8. Since the potential fixing region 14 is in direct contact with the guard region 8 in this manner, a source potential can be more easily supplied to the guard region 8 than a case where power is supplied via the body layers 5 and 5a.

In addition, the current spreading layer 7 is not interrupted at the end portion of the unit cell in the Y direction as shown in FIG. 17. That is, the current spreading layer 7 extends continuously between the plurality of unit cells arranged in the Y direction. As a result, the trench gate electrode and the current spreading layer 7 can be formed even in the region 1B for potential fixing, and thus, it is possible to fix the potential of the guard region 8 by providing the region 1B without decreasing a channel width. That is, an effect of reducing a channel resistance can be obtained as compared with a structure in which the current spreading layer 7 is interrupted in the Y direction.

Here, since the potential fixing region 14 is deeply formed as shown in FIG. 15, a formation region of the JFET region 13 decreases as compared with the SiC power MISFET described with reference to FIGS. 1 to 7. However, even if a resistance value of the JFET region 13 increases as a result, the trade-off between loss and short-circuit tolerance can be improved since the effect of reducing the channel resistance obtained by the fact that the current spreading layer 7 is not interrupted in the Y direction is large.

<Third Modification>

Next, a configuration in which each of a plurality of unit cells arranged in a cell array is arranged in the same layout without inversion in the X direction will be described with reference to FIGS. 18 and 19 as a third modification of the present embodiment.

Figure 18:
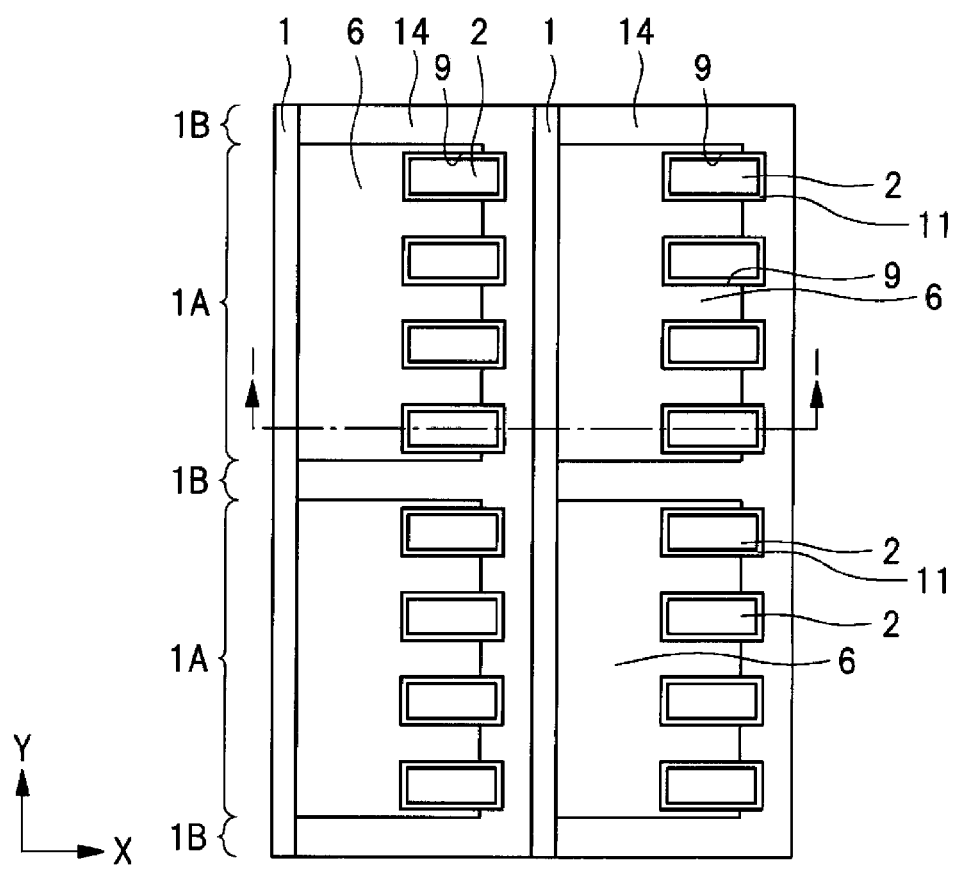
FIG. 18 is a plan view showing a silicon carbide semiconductor device which is a third modification of the first embodiment of the present invention.
Figure 19:
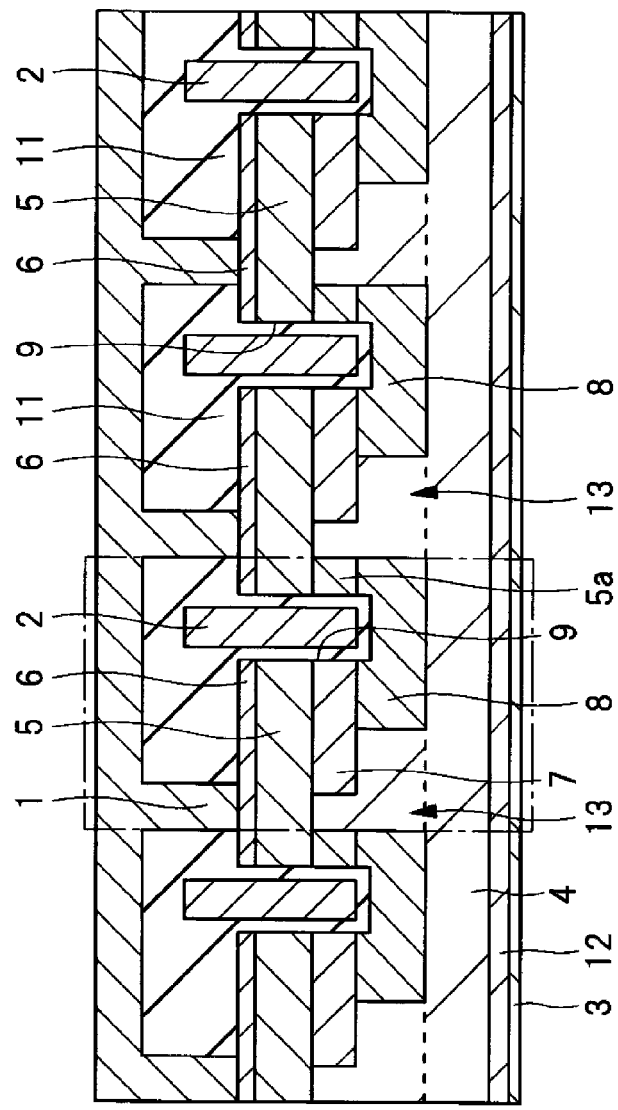
FIG. 19 is a cross-sectional view taken along a line I-I of FIG. 18.

As shown in FIGS. 18 and 19, unit cells adjacent to each other in the X direction have the same structure without being line-symmetric. Therefore, the source electrodes 1 in all the unit cells are located on one end portion side in the X direction of a cell array in each of the unit cells, and the trench 9 and the guard region 8 are located on the other end portion side in the X direction of the cell array. Therefore, the guard region 8 in a predetermined unit cell and the body layers 5 and 5a immediately above the guard region 8 are adjacent to the source electrode 1 in another unit cell adjacent to the unit cell in the X direction in a plan view. That is, a connection portion between the source electrode 1 and the potential fixing region 14 in the region 1B and the guard region 8 are electrically connected to each other at a short distance via a boundary between adjacent unit cells. Therefore, a potential of the guard region 8 is easily fixed, so that the reliability of a silicon carbide semiconductor device can be improved.

Accordingly, a ratio of the area occupied by the region 1B in a unit cell and in a cell array can be reduced. That is, it is possible to prevent reduction in channel resistance and JFET resistance, and to miniaturize the silicon carbide semiconductor device.

<Fourth Modification>

Next, a configuration in which one side surface of a trench at an end portion in a unit cell in the Y direction is separated from a source electrode and covered with a potential fixing region will be described with reference to FIG. 20 as a fourth modification of the present embodiment.

Figure 20:
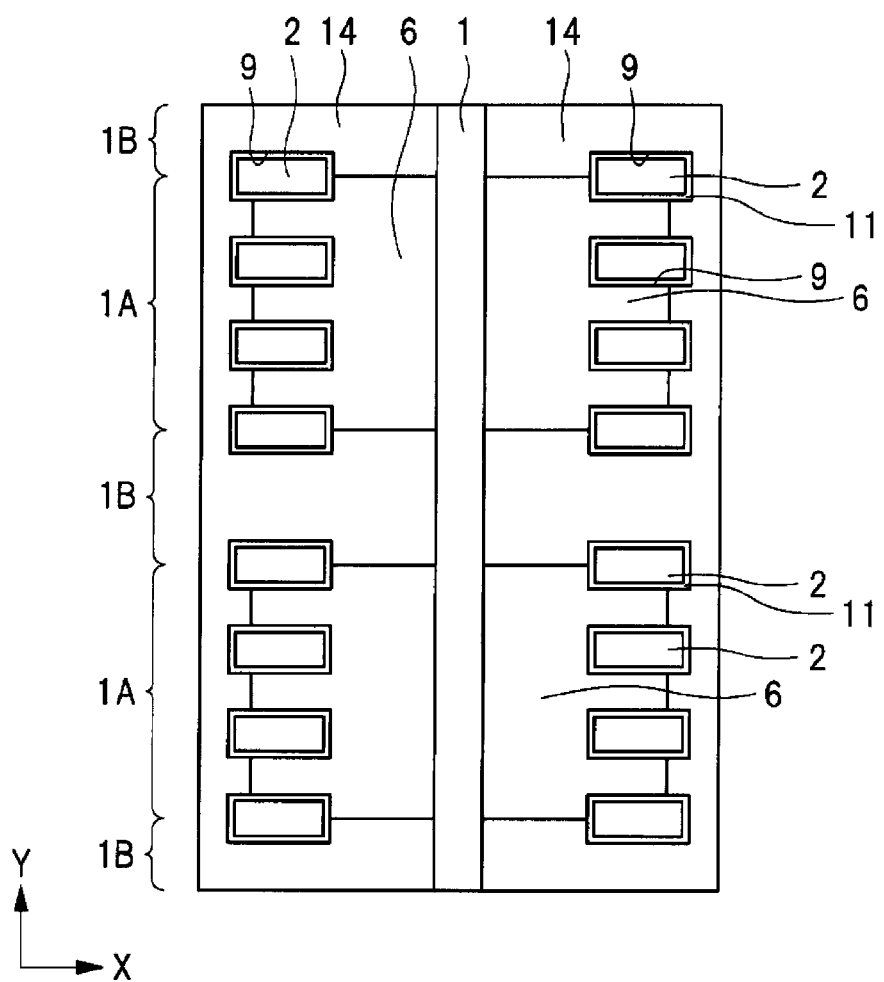
FIG. 20 is a plan view showing a silicon carbide semiconductor device which is a fourth modification of the first embodiment of the present invention.

As shown in FIG. 20, the trench 9 located closest to the end portion in the Y direction of one unit cell is formed to straddle a boundary between the source region 6 and the potential fixing region 14, that is, a boundary between the region 1A and the region 1B. Therefore, the trench 9 at the end portion in the Y direction in one unit cell has a side surface on a terminal end portion side in the Y direction of the unit cell being not in contact with the source region 6 but in contact only with the potential fixing region 14. That is, the side surface of the trench 9 is separated from the source region 6 and is in contact only with the potential fixing region 14 in a plan view. In the present modification, all side surfaces of the trenches 9, closest to the respective terminal portions on both sides in the Y direction in the unit cell, on the terminal portion side are separated from the source regions 6.

When a SiC power MISFET is in an off-state, a p-type semiconductor region formed on the side surface of the trench 9 on the potential fixing region 14 side is set in a state of accumulating charges, that is, a conductive state. Therefore, potentials of a body layer and a guard region when turned off can be stably fixed, so that the off-state can be easily maintained. Therefore, the reliability of a silicon carbide semiconductor device can be improved.

<Fifth Modification>

Next, a case where one side surface of all trenches in the Y direction are separated from a source electrode in the Y direction and covered with a potential fixing region will be described with reference to FIG. 21 as a fifth modification of the present embodiment.

Figure 21:
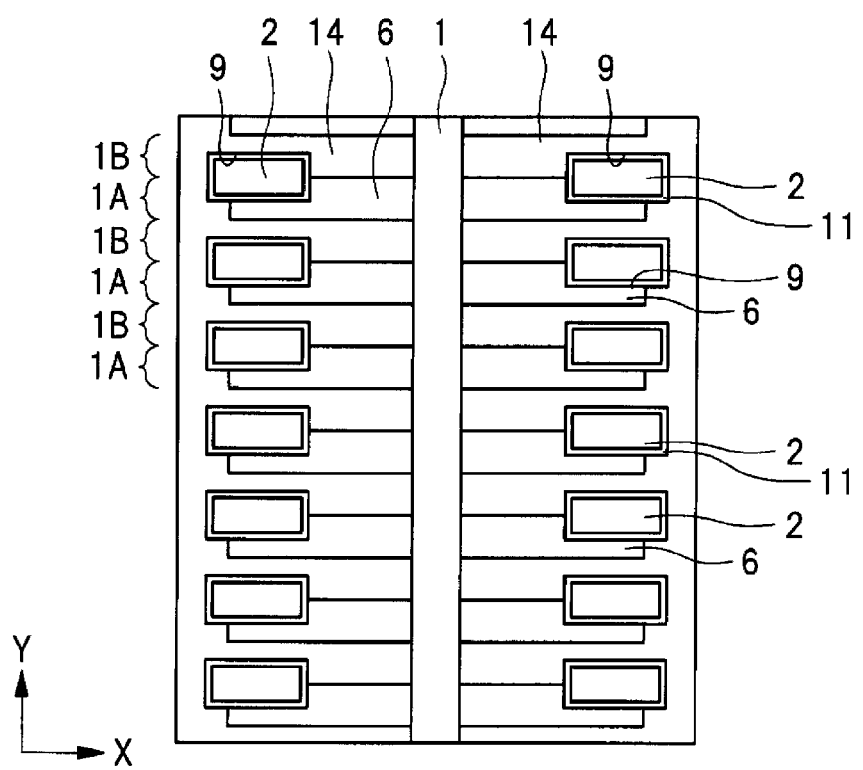
FIG. 21 is a plan view showing a silicon carbide semiconductor device which is a fifth modification of the first embodiment of the present invention.

As shown in FIG. 21, one side surfaces of the respective trenches 9 in the Y direction (an extending direction of the source electrode 1, an extending direction of a trench formation region, and an extending direction of a JFET region) are all in contact only with the potential fixing region 14, and the other side surfaces of the respective trenches 9 are in contact with source region 6. The plurality of trenches 9 arranged in the Y direction are in contact with the different source regions 6, respectively. That is, one source region 6 is in contact with only one trench 9 in the Y direction.

All the trenches 9 are formed to straddle a boundary between the source region 6 and the potential fixing region 14, that is, a boundary between the region 1A and the region 1B. Therefore, the trench 9 has one side surface in the Y direction that is not in contact with the source region 6. That is, this side surface of the trench 9 is separated from the source region 6 in a plan view. In the present modification, the trench 9, the potential fixing region 14, and the source region 6 are repeatedly arranged in order in the Y direction in a plan view.

A p-type semiconductor region formed on the side surface of the trench 9 on the potential fixing region 14 side is set in a conductive state when turned off, which is similar to the fourth modification. Therefore, potentials of a body layer and a guard region when turned off can be stably fixed, so that the off-state can be easily maintained. Here, one side surfaces of all the trenches in the Y direction are in contact with only the potential fixing region 14 in a plan view, and thus, the potentials of the body layer and the guard region when turned off can be stably fixed more effectively as compared with the fourth modification. Therefore, the reliability of a silicon carbide semiconductor device can be improved.

In the present modification, the source region 6 is in contact with only two surfaces of the trench 9 in a plan view, but the body layer below the source region 6 is in contact with all the four side surfaces of the trench 9. Thus, channels can be formed on all the four side surfaces, but an effective channel width decreases as compared with the structures described with reference to FIGS. 1 to 20. However, if a ratio of a channel resistance accounting for a total resistance of a SiC power MISFET is sufficiently small, there is no problem even if the channel resistance is increased as compared with the structures described with reference to FIGS. 1 to 20. In the present modification, it is unnecessary to arrange the source region 6, the potential fixing region 14 (region 1B) and the source region 6 in order between the trenches 9 adjacent in the Y direction, and thus, it is easy to reduce an interval between the trenches 9 in the Y direction. As a result, the density of the trench 9 and the source region 6 can be increased, so that the above-described decrease in the channel width can be prevented.

Second Embodiment

Hereinafter, a SiC power MISFET having a planar layout in which a source electrode, a trench formation region, and a JFET region are arranged in order will be described with reference to FIGS. 22 to 27.

The SiC power MISFET of the present embodiment is different from that of the first embodiment in terms that the JFET region is not arranged immediately below the source electrode, and a trench is formed between the source electrode and the JFET region in the X direction in a plan view.

Figure 22:
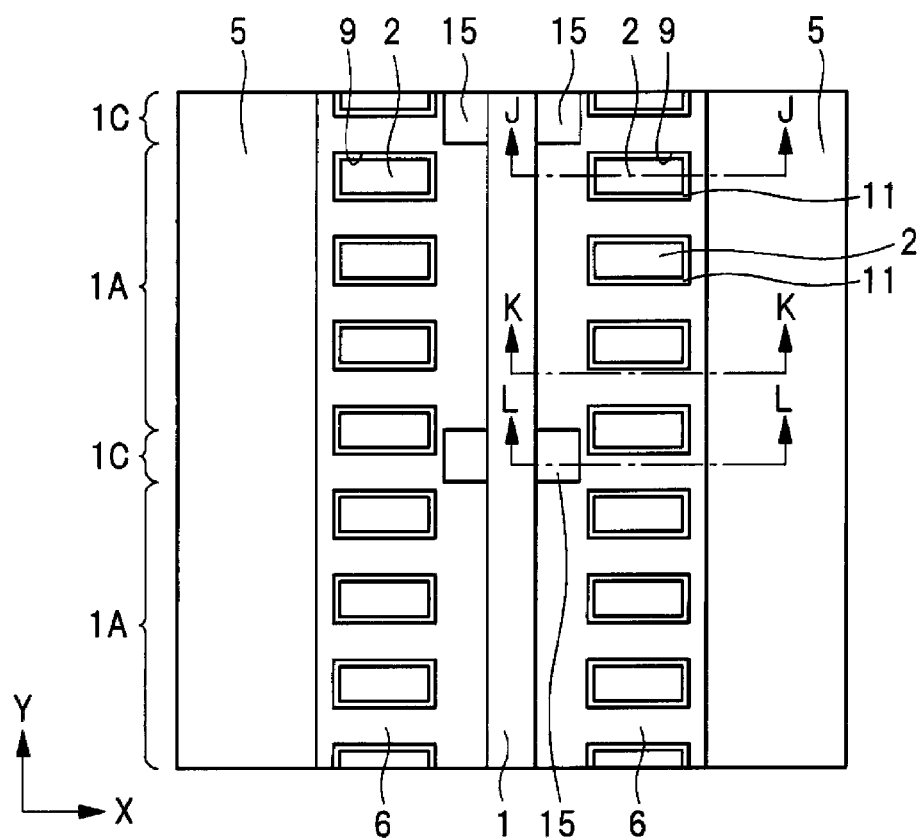
FIG. 22 is a plan view showing a silicon carbide semiconductor device which is a second embodiment of the present invention.
Figure 23:
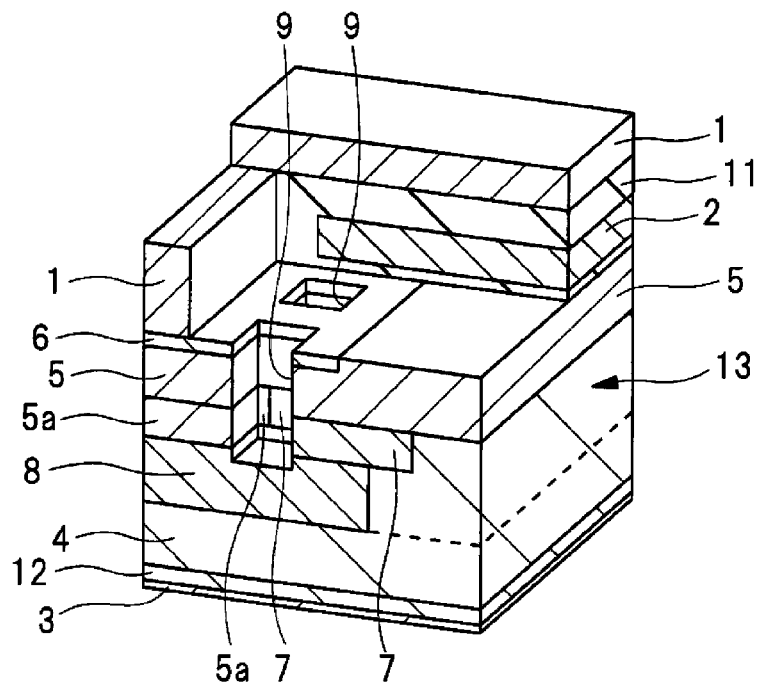
FIG. 23 is a perspective view showing the silicon carbide semiconductor device which is the second embodiment of the present invention.
Figure 24:
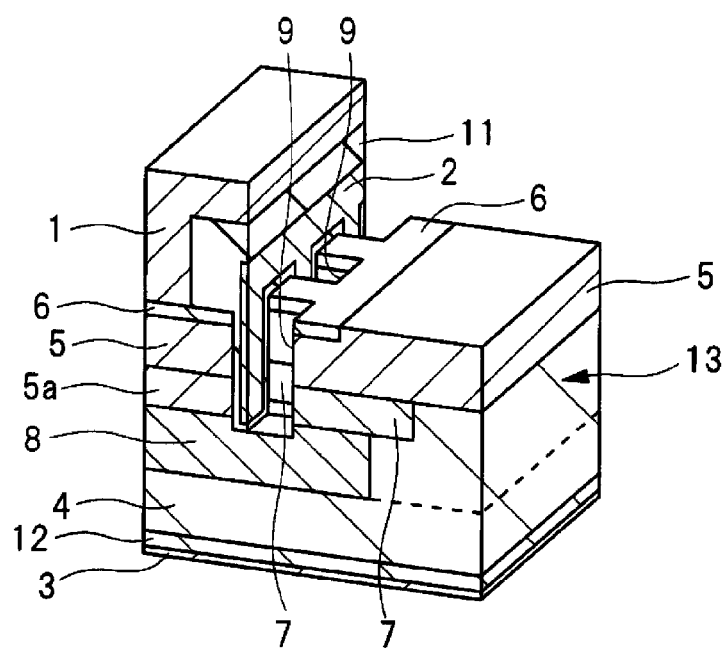
FIG. 24 is a perspective view showing the silicon carbide semiconductor device which is the second embodiment of the present invention.
Figure 25:
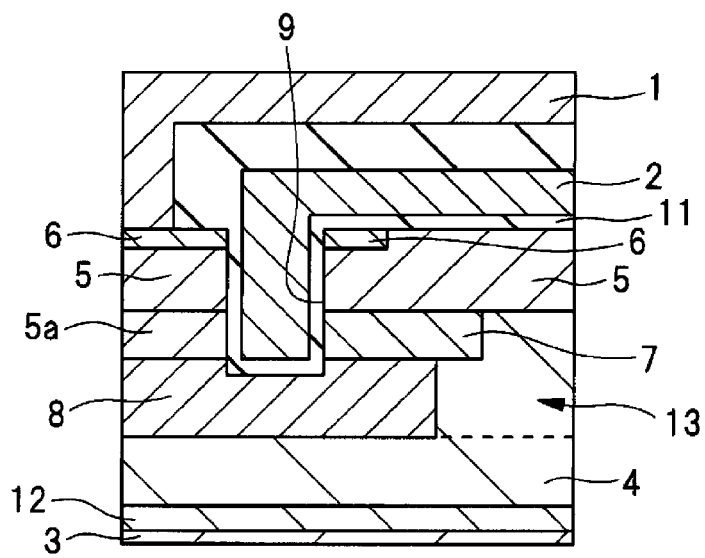
FIG. 25 is a cross-sectional view taken along a line J-J of FIG. 22.
Figure 26:
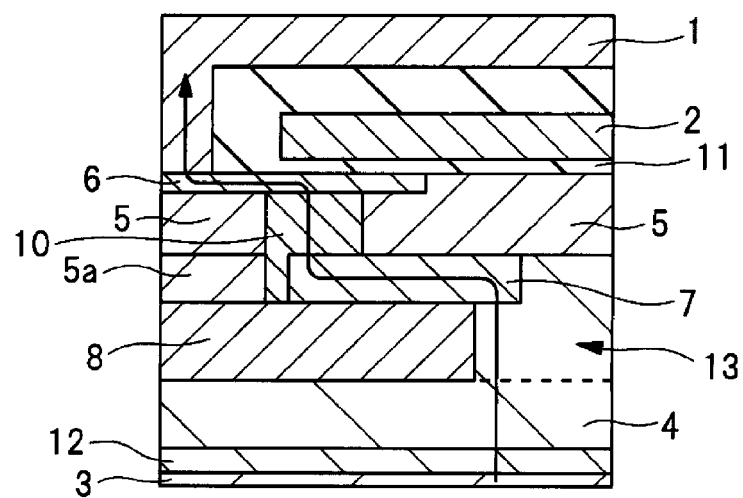
FIG. 26 is a cross-sectional view taken along a line K-K of FIG. 22.

As shown in FIG. 22, a point that the source electrode 1 extending in the Y direction in a plan view, the source region 6, and the plurality of trenches 9 and the gate electrodes 2 that are in contact with the source region 6 and are arranged in the Y direction are formed is the same as the first embodiment. However, the periphery of the trench 9 is surrounded by the source region 6 in a plan view. The body layer 5 is formed, instead of a potential fixing region, on an upper surface of an epitaxial layer at an end portion of a unit cell in the X direction opposite to the source electrode 1. That is, the body layer 5 on the upper surface of the epitaxial layer is integrated with the body layer 5 below the source region 6. The body layer 5 and the trench 9 on the upper surface of the epitaxial layer are separated from each other.

The plurality of potential fixing regions 15 are formed immediately below the source electrode 1 to be arranged in the Y direction, which is similar to the second modification of the first embodiment (see FIG. 13). However, the potential fixing region 15, which is a $p^{++}$-type semiconductor region, is formed in contact with an upper surface of the body layer 5 and does not reach a depth below the body layer 5, which is different from the second modification of the first embodiment. However, the potential fixing region 15 may be formed deeply so as to be in contact with the guard region 8 (see FIG. 23) similarly to the second modification of the first embodiment.

Figure 27:
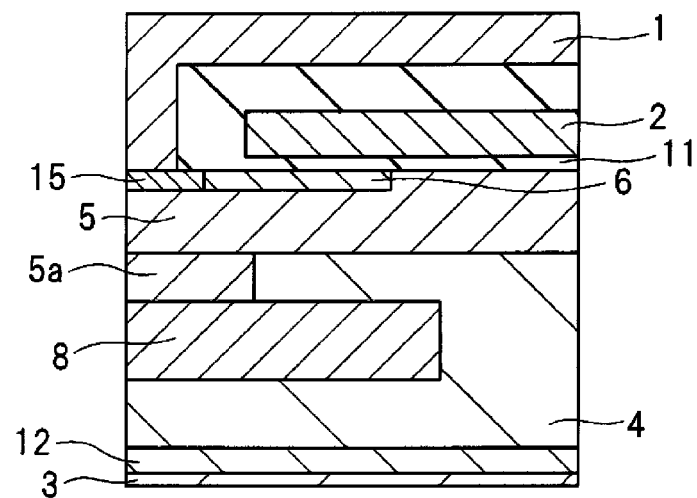
FIG. 27 is a cross-sectional view taken along a line L-L of FIG. 22.

In a cell array of the present embodiment, regions 1A and 1C are alternately arranged in the Y direction, and the potential fixing region 15 is formed in the region 1C. However, the trench 9 and the source region 6 are formed in the region 1C as in the region 1A. That is, the source region 6 extends between a plurality of unit cells arranged in the Y direction. As shown in FIG. 27, the current spreading layer 7 is not formed in the region 1C.

As shown in FIGS. 23 to 27, the SiC power MISFET of the present embodiment includes: the drain electrode 3, the drain region 12, the drift layer 4, the body layers 5 and 5a, the source region 6, the current spreading layer 7, the guard region 8, the JFET region 13, the trench 9, the insulating film 11, the gate electrode 2, the source electrode 1, and the potential fixing region 15. Here, the guard region 8 is formed immediately below the source electrode 1 extending in the Y direction, and a region immediately below the source electrode 1 extending in the Y direction and the JFET region 13 are separated from each other. The guard region 8 covers all corners of the trench 9 penetrating through the source region 6 and the body layer 5.

Below the source region 6, four side surfaces of the trench 9 are continuously in contact with the body layer 5. That is, the body layer 5 surrounds the periphery of the trench 9 in a plan view. In addition, the current spreading layer 7 formed between the body layer 5 and the guard region 8 are in contact with a total of three side surfaces, that is, a side surface far from the source electrode 1 in a plan view and side surfaces on both sides in the Y direction in a unit cell among the four side surfaces of the trench 9. That is, among the four side surfaces of the trench 9, one side surface on the source electrode 1 side is separated from the current spreading layer 7, and is in contact only with the body layer 5a at the same height as the current spreading layer 7.

In the X direction, the source region 6 terminates at a position farther from the source electrode 1 than the trench 9. In addition, the guard region 8 terminates at a position farther from the source electrode 1 than the source region 6 in the X direction. In addition, the current spreading layer 7 terminates at a position farther from the source electrode 1 than the guard region 8 in the X direction. In addition, the JFET region 13 is formed to be adjacent to the guard region 8 below the current spreading layer 7, and is arranged at a position farther from the source electrode 1 than the guard region 8 in the X direction. That is, the JFET region 13 is formed in the drift layer 4 between the adjacent guard regions 8.

In this manner, the JFET region 13 is not arranged immediately below the source electrode 1 extending in the Y direction, and the source electrode 1, the trench formation region, and the JFET region 13 are arranged in order in the X direction in a plan view. Therefore, the effect of the first embodiment of miniaturization of the unit cell, which is obtained when the source electrode 1 extending in the Y direction and the JFET region 13 overlap in a plan view, is hardly obtained in the present embodiment. However, other effects of the first embodiment can be similarly obtained in the present embodiment.

That is, here, the gate electrode 2 is formed in a comb shape, and a plurality of trench gate electrodes are arranged so as to be separated from each other in the Y direction. Therefore, a channel width can be increased, and a channel resistance (on-resistance) of the SiC power MISFET can be reduced. That is, the performance of the silicon carbide semiconductor device can be improved.

In addition, each of source electrode 1, trench formation region and JFET region 13 extends independently, and thus, each of these three portions can be designed independently. Accordingly, the degree of freedom in designing the silicon carbide semiconductor device can be improved.

In addition, depletion layers are closed between the adjacent guard regions 8 in the off-state of the SiC power MISFET by forming the guard region 8 and the JFET region 13. As a result, it is possible to suppress a minute current and improve a withstand voltage, and to ensure the withstand voltage of an element. Since the guard region 8 covers the corners of the trench 9, it is possible to prevent an electric field from being concentrated on the vicinity of the corner of the trench 9 and preventing occurrence of dielectric breakdown between the epitaxial layer and the gate electrode 2.

In addition, the current spreading layer 7 is formed by reversely implanting n-type impurity ions to the p-type semiconductor region, and has a higher impurity concentration than the guard region 8. Therefore, current diffusion performance obtained by the current spreading layer 7 can be improved, and a region where the current flows in the drift layer 4 can be expanded in the horizontal direction. Accordingly, the resistance of the SiC power MISFET can be reduced.

Since the current spreading layer 7 is formed by the reverse implantation, the current spreading layer 7 is not formed in a region adjacent to the guard region 8 in the horizontal direction. Therefore, an n-type impurity concentration in a region between the adjacent guard regions 8 is lower than an n-type impurity concentration in the current spreading layer 7, and thus, the depletion layers are easily closed in the off-state of the element. Therefore, the reliability of the silicon carbide semiconductor device can be enhanced.

In addition, a shortest distance from a side surface of the trench 9 to an end portion of the guard region 8 on the source electrode 1 side is 0.3 μm or more. Since the guard region 8 covers the corner of the trench 9 thickly in the horizontal direction in this manner, an electric field at the corner of the trench 9 can be made close to zero, and the occurrence of dielectric breakdown at the corner can be prevented.

Further, a path (the body layers 5 and 5a) for potential supply to the guard region 8 can be formed immediately below the source electrode 1 in the present embodiment, which is different from the first embodiment. Thus, a potential of the guard region 8 can be easily fixed. Accordingly, dielectric breakdown at the corner of the trench 9 is prevented, and the depletion layers can be easily closed between the adjacent guard regions 8 in the off-state of the SiC power MISFET. That is, the withstand voltage performance of the silicon carbide semiconductor device can be enhanced.

Although the description has been given in detail regarding the invention made by the present inventors based on the embodiments as above, the present invention is not limited to the embodiments, and, of course, can be modified in various ways within a scope not departing from a gist thereof.

For example, a material, a conductivity type, a manufacturing condition, and the like of each part are not limited to those described in the above embodiments, and, of course, can be modified in many ways. Although a description has been given assuming fixed conductivity types of the semiconductor substrate and the semiconductor film for convenience of description, the invention is not limited to the conductivity types described in the above embodiments.

Although the n-type SiC power MISFET has been described in the first and second embodiments, the effects of the first and second embodiments can also be obtained in a p-type SiC power MISFET in which conductivity types of the respective semiconductor regions are inverted.

In addition, the second to fifth modifications of the first embodiment can be combined with each other. However, the third modification of the first embodiment is not combinable with the first modification of the first embodiment. In addition, the first to fifth modifications of the first embodiment can be combined with the second embodiment.

What is claimed is:

1. A silicon carbide semiconductor device comprising:
  a silicon carbide semiconductor substrate of a first conductivity type;
  a drain electrode connected to a lower surface of the silicon carbide semiconductor substrate;
  a semiconductor layer of the first conductivity type that is formed on the silicon carbide semiconductor substrate and contains silicon carbide;

a first semiconductor region of the first conductivity type formed on an upper surface of the semiconductor layer;

a second semiconductor region of a second conductivity type, different from the first conductivity type, formed below the first semiconductor region in the semiconductor layer;

a third semiconductor region of the first conductivity type that is formed below the second semiconductor region in the semiconductor layer, has a lower impurity concentration than the first semiconductor region and the silicon carbide semiconductor substrate, and is in contact with the silicon carbide semiconductor substrate;

a plurality of trenches that are formed from the upper surface of the semiconductor layer to an intermediate depth of the semiconductor layer below the second semiconductor region and arranged in a first direction along the upper surface of the semiconductor layer, the trench having a rectangular planar shape;

a gate electrode formed inside each of the plurality of trenches via an insulating film; and a source electrode that is electrically connected to the first semiconductor region and extends in the first direction, wherein at least three side surfaces among four side surfaces of the trench are in contact with the second semiconductor region.

2. The silicon carbide semiconductor device according to claim 1, further comprising a fourth semiconductor region of the first conductivity type that is formed below the second semiconductor region in the semiconductor layer, is in contact with the side surface of the trench, and has a higher impurity concentration than the third semiconductor region;

a fifth semiconductor region of the second conductivity type that is formed immediately below the fourth semiconductor region in the semiconductor layer, is continuously in contact with a bottom surface and the side surface of the trench, and has a higher impurity concentration than the second semiconductor region; and a sixth semiconductor region of the first conductivity type that is adjacent to the fourth semiconductor region and the fifth semiconductor region in the semiconductor layer and has a lower impurity concentration than the fourth semiconductor region, wherein the sixth semiconductor region extends in the first direction.

3. The silicon carbide semiconductor device according to claim 2, wherein the fourth semiconductor region has a higher impurity concentration than the fifth semiconductor region.

4. The silicon carbide semiconductor device according to claim 2, further comprising:

a plurality of unit cells each of which is constituted by the first semiconductor region, the second semiconductor region, the third semiconductor region, the fourth semiconductor region, the fifth semiconductor region, the sixth semiconductor region, the trench, and the gate electrode, the plurality of unit cells repeatedly provided in the first direction in a plan view;

a first region that is a first end portion of the unit cell in the first direction and is separated from each of the fourth semiconductor region and the first semiconductor region in a plan view; and a seventh semiconductor region of the second conductivity type that is formed on the upper surface of the semiconductor layer in the first region and has a higher impurity concentration than the second semiconductor region, wherein the second semiconductor region and the fifth semiconductor region are electrically connected to the source electrode via the seventh semiconductor region.

5. The silicon carbide semiconductor device according to claim 4, wherein the unit cell includes a second end portion and a third end portion opposite to the second end portion in a second direction orthogonal to the first direction in a plan view, the source electrode is located at the second end portion, the third end portion and the first semiconductor region are separated from each other, and the seventh semiconductor region is formed on the upper surface of the semiconductor layer at the third end portion.

6. The silicon carbide semiconductor device according to claim 2, wherein the source electrode and the sixth semiconductor region overlap with each other in a plan view.

7. The silicon carbide semiconductor device according to claim 2, further comprising a plurality of unit cells each of which is constituted by the first semiconductor region, the second semiconductor region, the third semiconductor region, the fourth semiconductor region, the fifth semiconductor region, the sixth semiconductor region, the trench, and the gate electrode, the plurality of unit cells repeatedly provided in the first direction in a plan view, wherein the source electrode, the trench, and the sixth semiconductor region in the unit cell are sequentially arranged in a second direction orthogonal to the first direction in a plan view.

8. The silicon carbide semiconductor device according to claim 1, further comprising a plurality of seventh semiconductor regions of the second conductivity type that are formed on the upper surface of the semiconductor layer immediately below the source electrode, have a higher impurity concentration than the second semiconductor region, and are arranged in the first direction, wherein the seventh semiconductor region is in contact with the second semiconductor region, and the second semiconductor region and the source electrode are electrically connected via the seventh semiconductor region.

9. The silicon carbide semiconductor device according to claim 4, wherein among the four side surfaces of the trench located at a fourth end portion in the first direction of the unit cell, the side surface on one side in the first direction is in contact with the seventh semiconductor region and is separated from the first semiconductor region, and the side surface on another side in the first direction is in contact with the first semiconductor region.

10. The silicon carbide semiconductor device according to claim 2, further comprising a plurality of seventh semiconductor regions of the second conductivity type that are formed on the upper surface of the semiconductor layer immediately below the source electrode, have a higher impurity concentration than the second semiconductor region, and are arranged in the first direction, wherein the seventh semiconductor region is in contact with each of the second semiconductor region and the fifth semiconductor region, and the second semiconductor region and the source electrode are electrically connected via the seventh semiconductor region.

11. The silicon carbide semiconductor device according to claim 2, wherein
a shortest distance from a side surface of the trench to an end portion of the fifth semiconductor region is 0.3 μm or more in a second direction orthogonal to the first direction in a plan view.

12. The silicon carbide semiconductor device according to claim 1, wherein
the trench extends in a second direction orthogonal to the first direction in a plan view.

13. The silicon carbide semiconductor device according to claim 1, wherein
the first semiconductor region, the second semiconductor region, the third semiconductor region, the trench, and the gate electrode constitute each of a plurality of unit cells repeatedly provided in a second direction orthogonal to the first direction in a plan view, and
each structure of the unit cells adjacent in the second direction has a line-symmetric relation in a plan view.

14. The silicon carbide semiconductor device according to claim 1, wherein
the first semiconductor region, the second semiconductor region, the third semiconductor region, the trench, the source electrode, and the gate electrode constitute each of a plurality of unit cells repeatedly provided in a second direction orthogonal to the first direction in a plan view,
the plurality of unit cells constitute a cell array, and
the source electrode is located at a fifth end portion on one side of the cell array in the second direction in each of the plurality of unit cells.

* * * * *